United States Patent [19]

Nagami

[11] 4,090,096
[45] May 16, 1978

[54] TIMING SIGNAL GENERATOR CIRCUIT
[75] Inventor: Akira Nagami, Tokyo, Japan
[73] Assignee: Nippon Electric Co., Ltd., Tokyo, Japan
[21] Appl. No.: 782,419
[22] Filed: Mar. 29, 1977
[30] Foreign Application Priority Data
  Mar. 31, 1976  Japan .................. 51-35825
[51] Int. Cl.² .............. H03K 1/18; H03K 5/01; H03K 17/28; G11C 8/00
[52] U.S. Cl. .................. 307/269; 307/208; 307/246; 307/265; 307/DIG. 4; 365/233
[58] Field of Search ............. 307/208, 262, 265, 266, 307/268, 269, DIG. 1, DIG. 4, DIG. 5, 246; 365/203, 204, 233

[56] References Cited
U.S. PATENT DOCUMENTS

| | | | |
|---|---|---|---|
| 3,774,055 | 11/1973 | Bapat | 307/208 X |
| 3,778,784 | 12/1973 | Karp et al. | 307/DIG. 4 X |
| 3,866,176 | 2/1975 | Baitinger et al. | 307/DIG. 4 X |
| 3,903,431 | 9/1975 | Heeren | 307/DIG. 4 X |
| 3,906,464 | 9/1975 | Lattin | 307/DIG. 4 X |
| 3,959,781 | 5/1976 | Mehta et al. | 307/208 X |
| 3,988,617 | 10/1976 | Price | 307/DIG. 4 X |
| 4,038,646 | 7/1977 | Mehta et al. | 365/203 X |
| 4,061,933 | 12/1977 | Schroeder et al. | 307/DIG. 4 X |

Primary Examiner—Larry N. Anagnos
Attorney, Agent, or Firm—Hopgood, Calimafde, Kalil, Blaustein & Lieberman

[57] ABSTRACT

A timing signal generator includes a field-effect transistor having a drain supplied with a command signal and a source connected to an output node. The gate of the transistor is connected to a circuit node which is precharged to a voltage to render the transistor conductive prior to the activation of the command signal. A delay circuit having a predetermined delay time has an input connected to the output node and an output connected to a circuit for discharging the output node and the circuit node in response to the output of the delay circuit.

10 Claims, 8 Drawing Figures

TIMING SIGNAL GENERATOR CIRCUIT

The present invention relates to timing signal generators and more particularly to a timing signal generator circuit making use of field effect transistors.

Dynamic circuits employing insulated-gate type filed effect transistors (hereinafter referred to as MOST because their typical examples are MOS type transistors) and adapted to perform dynamic operations, are widely used in memory circuits, logic circuits or the like. This dynamic circuit eliminates the D.C. path within the circuit by using the capacitance associated with the gate of the MOST and the capacitance associated with the wiring as temporary memory elements, and consequently, the overall power dissipation of the circuit is very small. Accordingly, this circuit is used to advantage in large scale integrated LSI circuits. A dynamic circuit employing MOST's often requires a circuit for generating a timing signal which rises in synchronism with an input signal pulse and falls after a given period, which can be shorter than the pulse width of the input signal. A memory circuit is one example of a circuit having a requirement of this nature.

The operation period of a memory circuit employing MOST's is divided into an activated operation period and a reset-precharge period. The clock timing signals for driving the circuit in these periods are called the "activation timing signal" and the "precharge timing signal", respectively. The former signal is concerned with the excsution of the essential circuit operation, whereas the latter signal achieves the function of resetting the state of the circuit at the end of the preceding activated operation period and presetting the circuit for the next subsequent activated operation period. The MOS memory circuit derives these activation timing signals and the precharge timing signal in response to one clock signal received from an external circuit. However, in the known memory circuits, the activation signals or the precharge signal could not be generated immediately after the reception of the clock signal from the external circuit. The timing signals in the prior memory circuits were generated with a predetermined period of delay, and, therefore, the operation speed of the memory circuit was slow. Therefore, a timing signal which rises immediately with a command signal to produce an activation or precharge signal and which falls immediately after its function is required in a MOS memory circuit.

An object of the present invention is, therefore, to provide a circuit for generating an output waveform which rises substantially in synchronism with an input signal pulse and falls after a period that can be determined in a range shorter than the pulse width of the input signal.

Another object of the present invention is to provide a timing signal generator circuit which can generate a timing signal for a memory circuit as soon as possible in response to an external command signal.

A timing signal generator circuit according to the present invention comprises a MOST having a gate, a source and a drain, the drain being supplied with a command signal, the source being connected to an output node, and the gate being connected to a circuit node. Means are provided to precharge the circuit node up to a voltage adapted to bring the MOST to a conducting state prior to the activation of the command signal. A delay circuit having a predetermined delay time has an input connected to the output node, and means connected to the output of the delay circuit is provided to discharge the output node and the circuit node in response to the output of the delay circuit.

The invention is described in greater detail with reference to the accompanying drawings, in which.

In the following description of the timing signal generator circuit of the invention N-channel type MOST's are used as the insulated-gate field-effect transistors. The N-channel type MOST becomes conductive when a high level signal is applied to its gate, and becomes non-conductive when a low level signal is applied to its gate. It will be understood that P-channel type MOST's may also be used in the circuit.

Figure 1:
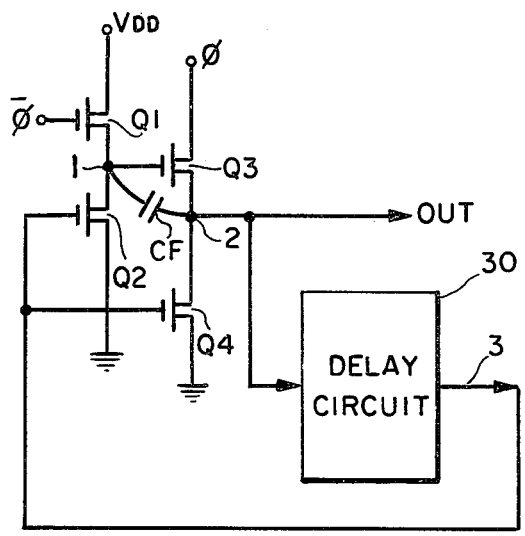
FIG. 1 is a circuit diagram of a timing signal generator circuit according to a preferred embodiment of the present invention.

Referring now to the circuit schematically illustrated in FIG. 1, a clock signal $\phi$ is applied to the drain of a MOST $Q_3$, and the source of the MOST $Q_3$ is connected to an output node 2 of the circuit. The gate of the MOST $Q_3$ is connected to a circuit node 1. The circuit node 1 is adapted to be charged up to a predetermined potential through a MOST $Q_1$. More particularly, the source of the MOST $Q_1$ is connected to the node 1, its drain is connected to a power supply $V_{DD}$, and a signal $\bar{\phi}$ that is of opposite phase to the signal $\phi$ is applied to its gate. The drains of MOST's $Q_2$ and $Q_4$ are, respectively, connected to nodes 1 and 2 for discharging the electric charge stored at these nodes. The sources of the MOST's $Q_2$ and $Q_4$ are both grounded. The output node 2 is connected to an input of a delay circuit 30 having a predetermined delay time, and the output 3 of the delay circuit is connected to the gates of the MOST's $Q_2$ and $Q_4$ to control their operation. A bootstrap capacitor $C_F$ is connected between the nodes 1 and 2.

Figure 2:
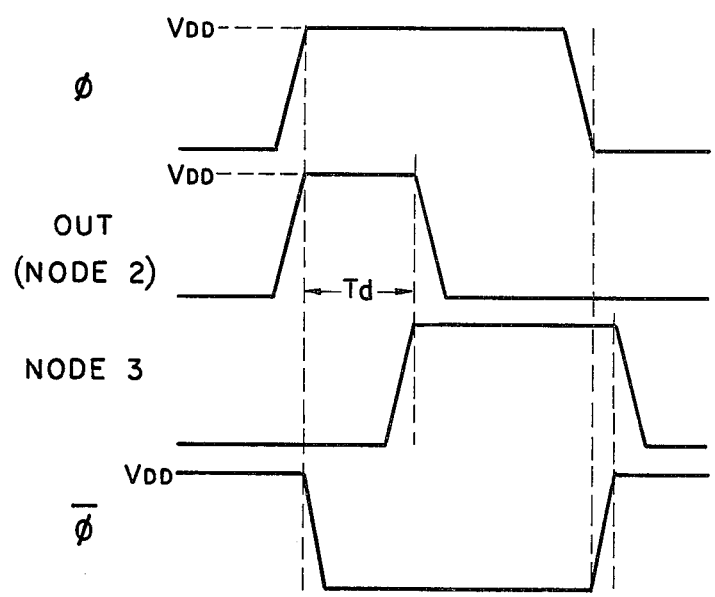
FIG. 2 is an operating waveform diagram for the circuit shown in FIG. 1.

Operations of the circuit shown in FIG. 1 will be described with reference to the operating waveform diagram of FIG. 2. Before the rise of the timing signal $\phi$, the signal $\bar{\phi}$ is normally at the level $V_{DD}$, and accordingly, the circuit node 1 is charged up to a level equal to $(V_{DD} - V_{TH})$, where $V_{TH}$ represents the threshold voltage of the MOST $Q_1$. Therefore, the bootstrap capacitor $C_F$ between the nodes 1 and 2 is charged up to the level of $(V_{DD} - V_{TH})$. When the signal $\phi$ rises to the level $V_{DD}$, the level at the node 1 is raised due to the capacitor $C_F$ to a potential represented by the following formula:

$$V_{DD} - V_{TH} + (C_F/C_1 + C_F) \times V_2$$

where $C_1$ represents the capacitance of the node 1 and $V_2$ represents the voltage at the node 2. Therefore, the MOST $Q_3$ is in the fully conducting condition, and hence the potential at the output node 2 rises almost synchronously with the signal $\phi$. Accordingly, the potential at the output 2 reaches up to the final level equal to the level $V_{DD}$ of the signal $\phi$. The output 3 of the delay circuit 30 rises with a delay of $T_d$ with respect to the rise of the potential at the node 2. When the potential at the output 3 rises, the MOST's $Q_2$ and $Q_4$ become conducting, and at this moment, since the signal $\bar{\phi}$ is at a low level and the MOST $Q_1$ is non-conducting, at first the potential at the node 1 is quickly lowered down to the ground potential by the conducting MOST $Q_2$. Accordingly, the MOST $Q_3$ subsequently becomes non-conducting and hence the node 2 takes a floating potential. Then, owing to the conduction of the MOST $Q_4$, the node 2 also falls quickly to the ground potential level. The operations during the period from the potential rise at the node 3 to the fall of the potential at the output node 2 down to the ground potential occur rapidly. The period in which the potential at the node 2 is at the level $V_{DD}$ is substantially equal to the delay time $T_d$ which is determined by the delay circuit 30. Accordingly, a desired output waveform appears at the node 2 with a pulse width that is shorter than the pulse width of the clock input $\phi$.

Figure 3:
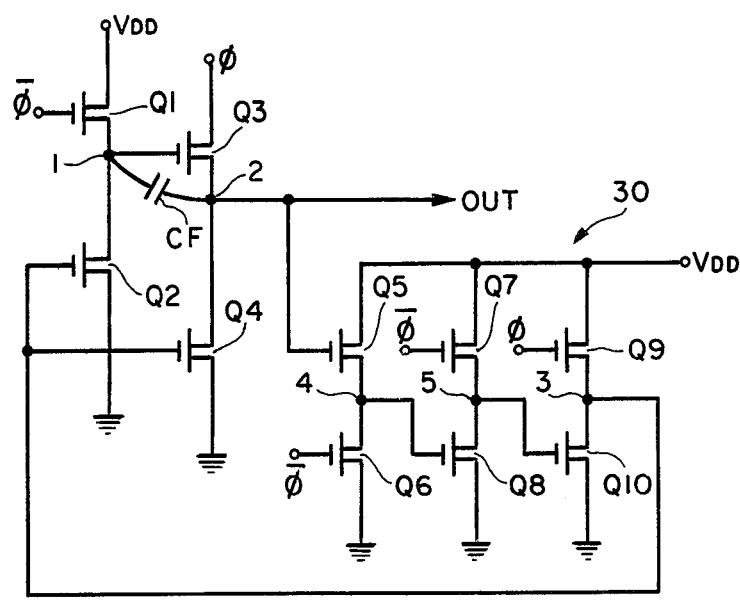
FIG. 3 is a more detailed circuit diagram of the circuit shown in FIG. 1.

One example of a more detailed circuit according to the present invention is shown in FIG. 3, in which the delay circuit 30 is composed of MOST's $Q_5$ to $Q_{10}$. Most particularly, the circuit output node 2 is connected to the gate of the MOST $Q_5$, and the source of the MOST $Q_5$ and the drain of the MOST $Q_6$ are both connected to node 4. The node 4 is connected to the gate of the MOST $Q_8$, and the drain of the MOST $Q_8$ and the source of the MOST $Q_7$ are both connected to the node 5. To gates of MOST's $Q_6$ and $Q_7$ are applied the signal $\bar{\phi}$. The node 5 is connected to the gate of the MOST $Q_{10}$, and the drain of the MOST $Q_{10}$ and the source of the MOST $Q_9$ are both connected to an output node 3 of the delay circuit 30. The signal $\phi$ is applied to the gate of the MOST $Q_9$. The drains of the MOST's $Q_5$, $Q_7$ and $Q_9$ are respectively connected to the power supply $V_{DD}$, and the sources of the MOST's $Q_6$, $Q_8$ and $Q_{10}$ are grounded.

Figure 4:
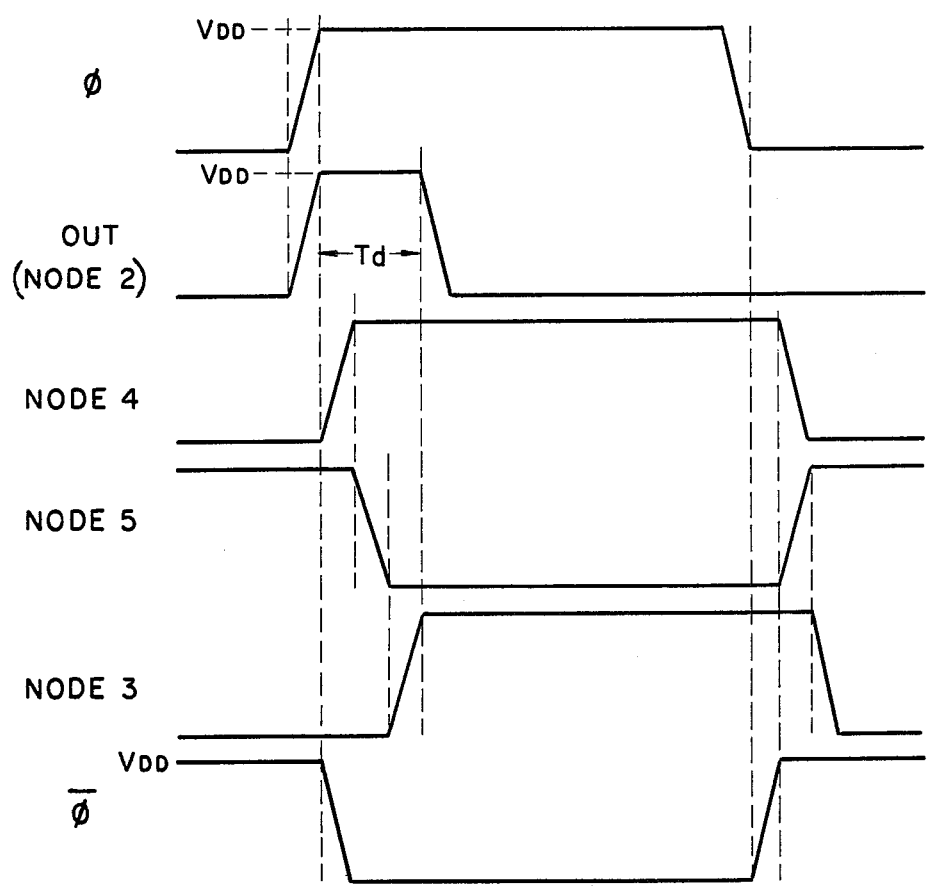
FIG. 4 is an operating waveform diagram for the circuit shown in FIG. 3.

The operation of the circuit shown in FIG. 3 is described with reference to FIG. 4. The clock signal $\bar{\phi}$ is normally at the level $V_{DD}$, and therefore, the node 4 is preset at the ground potential by the conducting MOST $Q_6$, the node 5 is preset at the level of ($V_{DD} - V_{TH}$) by the conducting MOST $Q_7$, and the output node 3 is preset at the ground potential by the conducting MOST $Q_{10}$. When the signal $\phi$ rises, the voltage at the output node 2 rises synchronously therewith, the MOST $Q_5$ becomes conducting, and after the signal $\bar{\phi}$ has been lowered sufficiently, the voltage at the node 4 begins to rise up to the level of ($V_{DD} - V_{TH}$). When the voltage at the node 4 exceeds the threshold value of the MOST $Q_8$, the MOST $Q_8$ become conducting. At this moment, the signal $\bar{\phi}$ is in the ground level and hence the MOST $Q_7$ is either non-conducting or transferring from a nearly non-conducting state to a non-conducting state, so that the voltage at the node 5 is lowered from level of ($V_{DD} - V_{TH}$) to the ground potential. The size ratio W/L of the MOST $Q_{10}$, where W represents the channel width and L represents the channel length in the integrated circuit chip, is selected larger than that of the MOST $Q_9$ so that the output of node 3 does not rise unless the MOST $Q_{10}$ is non-conducting or nearly non-conducting, although the MOST $Q_9$ becomes conducting when the signal $\phi$ rises. Accordingly, after the node 5 has been sufficiently lowered, the voltage at the output node 3 of the delay circuit rises up to the level of ($V_{DD} - V_{TH}$) by the charging through the conducting MOST $Q_9$. When the voltage at the output node 3 has risen over the threshold voltage $V_{TH}$, the voltage at the output node 2 is quickly lowered in level as described previously. As shown in FIG. 4, the time period from the rise of the voltage at the node 2 to the voltage at output rise of the node 3 is the delay time $T_d$ given by the delay circuit 30 consisting of the six MOST's $Q_5$ to $Q_{10}$, and this is substantially coincident with the period when the voltage at the output node 2 is at the higher level. The value of the delay time $T_d$ can be adjusted by suitably selecting the sizes of the MOST's $Q_5$, $Q_8$ and $Q_{10}$, and if the sizes of the MOST's $Q_5$ and $Q_8$ are selected small and the size of the MOST $Q_{10}$ is selected large, the delay time $T_d$ can be made long. In the circuit shown in FIG. 3, a D.C. current fed from the power supply $V_{DD}$ flows only through the MOST $Q_9$ during the delay time $T_d$ and that current can be suppressed to a small value, so that this circuit can be operated at low power.

To explain the advantages of the present invention, reference will be made to a prior art timing signal generator circuit to be used in a memory circuit illustrated in FIG. 7. This circuit is a part of a timing signal generator circuit for a MOS integrated memory circuit, and it has the function of generating a timing signal $\phi_1$, which activates an address inverter buffer circuit (not shown) that is one of the activation timing signals, and a precharge timing signal P over the whole integrated memory circuit, in response to a clock signal $\bar{\phi}_{TTL}$ applied externally.

The external command signal $\bar{\phi}_{TTL}$ is applied to the gate of a MOST $Q_{13}$, while the drain of the MOST $Q_{13}$ and the source of a MOST $Q_{12}$ are jointly connected to a node 12. The gate of the MOST $Q_{12}$ and the source of a MOST $Q_{11}$ are jointly connected to a node 11, and between the nodes 11 and 12 is provided a bootstrap capacitor $C_{F1}$. The node 12 serves as a gate input for a MOST $Q_{14}$, while the source of the MOST $Q_{14}$ and the drain of a MOST $Q_{15}$ are jointly connected to a node 13. To the gate of the MOST $Q_{15}$ is applied the signal $\bar{\phi}_{TTL}$. The node 13 serves as a gate input for the MOST $Q_{18}$, while the drain of the MOST $Q_{18}$ and the source of the MOST $Q_{17}$ are jointly connected to an output node 15, the gate of the MOST $Q_{17}$ and the source of a MOST $Q_{16}$ are jointly connected to a node 14, and a bootstrap capacitor $C_{F2}$ is connected between the nodes 14 and 15.

The drains of the MOST's $Q_{11}$, $Q_{12}$, $Q_{14}$, $Q_{16}$ and $Q_{17}$ and the gates of the MOST's $Q_{11}$ and $Q_{16}$ are connected to a power supply $V_{DD}$, while the sources of the MOST's $Q_{13}$, $Q_{15}$ and $Q_{18}$ are grounded. In this circuit, in response to the input signal $\bar{\phi}_{TTL}$, the precharge signal P for a memory circuit is generated at the output node 15.

The node 12 serves as a gate input for a MOST $Q_{22}$, the source of the MOST $Q_{22}$ and the drain of a MOST $Q_{23}$ are jointly connected to a node 18, and to the gate of the MOST $Q_{23}$ is applied a signal P. The node 18 serves as a gate input for a MOST $Q_{25}$, a drain of the MOST $Q_{25}$ and a source of a MOST $Q_{24}$ are jointly connected to a node 19, and to the gate of the MOST $Q_{24}$ is applied the signal P. The node 19 serves as a gate input for a MOST $Q_{21}$, and the drain of the MOST $Q_{21}$ and the source of a MOST $Q_{20}$ are jointly connected to an output node 17. The gate of the MOST $Q_{20}$ and the source of a MOST $Q_{19}$ are jointly connected to a node 16, and the drain of the MOST $Q_{19}$ is connected to the node 12. In addition, a bootstrap capacitor $C_{F3}$ is connected between the nodes 16 and 17.

The drains of the MOST's $Q_{20}$, $Q_{22}$ and $Q_{24}$ are connected to the power supply $V_{DD}$, while the sources of the MOST's $Q_{21}$, $Q_{23}$ and $Q_{25}$ are grounded, and the gate of the MOST $Q_{19}$ is connected to the power supply $V_{DD}$. In this circuit, in response to the input signal $\overline{\phi}_{TTL}$ and the signal P, a signal $\phi_1$ for activating an address buffer circuit is derived at the output node 17.

Figure 7:
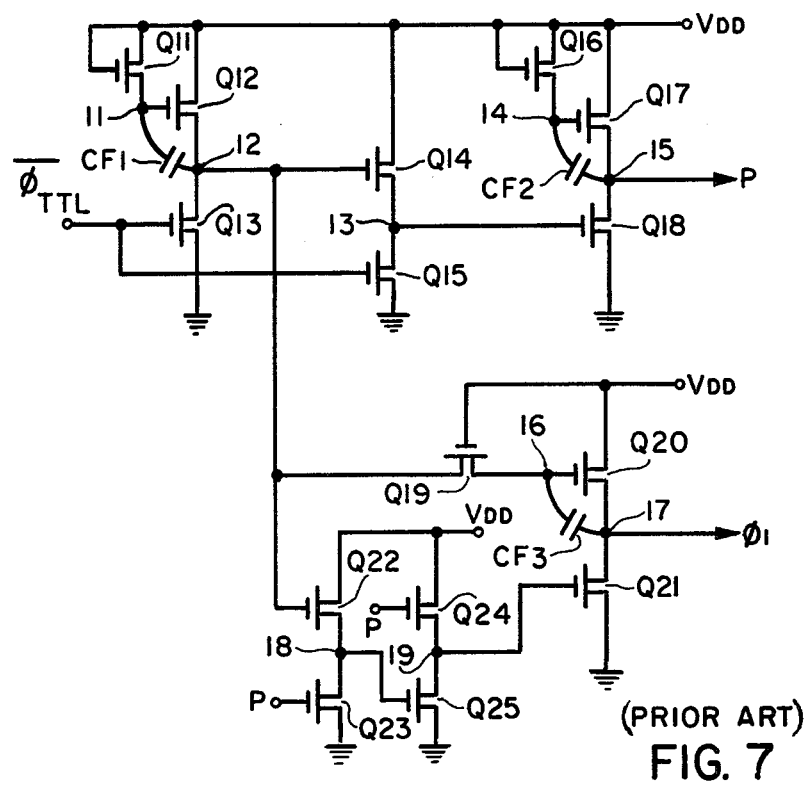
FIG. 7 is a circuit diagram of a prior art timing signal generator for a memory circuit which does not contain the circuit of the present invention.

The operation of the circuit shown in FIG. 7 is described with reference to FIG. 8. The period in which the clock signal $\overline{\phi}_{TTL}$ is at a low level corresponds to the activated operation period, whereas the period in which the clock signal $\overline{\phi}_{TTL}$ is at a high level corresponds to the reset-precharge period. When the signal $\overline{\phi}_{TTL}$ is at a high level, the nodes 11 and 19 are at the level of ($V_{DD}$ − $V_{TH}$), the nodes 13, 17 and 18 are at the ground potential, and the levels of the nodes 12 and 16 are substantially equal to each other and are made lower than the threshold voltage of the MOST by selecting the size of the MOST $Q_{13}$ to be sufficiently larger than that of the MOST $Q_{12}$. Owing to the effect of the bootstrap capacitor $C_{F2}$ between the nodes 14 and 15, the node 14 rises exceeding the level of $V_{DD}$ up to a potential represented by the following formula:

$$V_{DD} - V_{TH} + (C_{F2}/C_{14} + C_{F2}) \times V_{15},$$

when $C_{14}$ represents the capacitance of the node 14 and $V_{15}$ represents the potential at the node 15. The MOST $Q_{17}$ is in a fully conducting condition, and hence the node 15 is maintained at the level $V_{DD}$. When the signal $\overline{\phi}_{TTL}$ is transferred from a high level to a low level, the MOST's $Q_{13}$ and $Q_{15}$ become non-conducting, and owing to the effect of the bootstrap capacitor $C_{F1}$ between the nodes 11 and 12, the node 11 rises exceeding the level $V_{DD}$ up to a potential represented by the following formula:

$$V_{DD} - V_{TH} + (C_{F1}/C_{11} + C_{F1}) \times V_{12},$$

where $C_{11}$ represents the capacitance of the node 11, and $V_{12}$ represents the potential at the node 12. The MOST $Q_{12}$ is in a fully conducting condition, so that at first the node 12 rises up to the level $V_{DD}$ and then the node 13 rises up to the level of ($V_{DD} - V_{TH}$). Assuming that the size of the MOST $Q_{18}$ is sufficiently larger than the MOST $Q_{17}$, when the node 13 rises, the signal P transfers to a low level that is lower than the threshold voltage. When the signal P falls, the MOST's $Q_{23}$ and $Q_{24}$ become non-conducting, so that the node 18 rises up to the level of ($V_{DD} - V_{TH}$) by charging through the MOST $Q_{22}$, and subsequently, the node 19 falls from the charged level of ($V_{DD} - V_{TH}$) down to the ground potential. The bootstrap capacitor $C_{F3}$ between the nodes 16 and 17 is charged at the level of ($V_{DD} - V_{TH}$) until the node 19 falls, because the node 16 rises up to the level of ($V_{DD} - V_{TH}$) by charging through the MOST $Q_{19}$ in accordance with the rise of the node 12. When the node 19 falls and the MOST $Q_{21}$ becomes non-conducting, owing to the effect of the bootstrap capacitor $C_{F3}$, the node 16 rises exceeding the level $V_{DD}$ up to the voltage represented by the following formula:

$$V_{DD} - V_{TH} + (C_{F3}/C_{16} + C_{F3}) \times V_{17},$$

where $C_{16}$ represents the capacitance of the node 16 and $V_{17}$ represents the voltage at the node 17. The MOST $Q_{20}$ is in the unsaturated condition and thereby the signal $\phi_1$ rises up to the level of $V_{DD}$. This signal $\phi_1$ activates an address inverter buffer to commence the circuit operation of the memory.

When the signal $\overline{\phi}_{TTL}$ transfers to a high level, the MOST's $Q_{13}$ and $Q_{15}$ become conducting, and the MOST $Q_{14}$ becomes non-conducting. Therefore, the node 12 and then the node 13, respectively, transfer to a low level lower than the threshold and to the ground potential. When the voltage at the node 13 falls, the MOST $Q_{18}$ becomes non-conducting, and owing to the effect of the bootstrap capacitor $C_{F2}$, the signal P rises up to the voltage of $V_{DD}$. In response thereto, the node 18 is brought to ground potential by discharging through the MOST $Q_{23}$ because the MOST $Q_{22}$ has been already brought to the non-conducting state, so that the MOST $Q_{25}$ becomes non-conducting, and thereby the node 19 is charged through the MOST $Q_{24}$ up to the level of ($V_{DD} - V_{TH}$). The node 16 has been already brought to a low level lower than the threshold voltage together with the node 12 by discharging through the MOST $Q_{19}$, so that the MOST $Q_{20}$ is non-conducting, and therefore, in response to the potential rise of the node 19, the signal $\phi_1$ is immediately brought to ground potential.

The operation of the circuit shown in FIG. 7 is as described above. However, in this circuit, before the first activation timing signal $\phi_1$ begins to rise, a time of ($t_1 + t_2 + t_3 + t_4 + t_5$) is required as shown in FIG. 8.

The circuit shown in FIG. 7 generates a MOS level inverted output at the node 12 in response to an input clock signal $\overline{\phi}_{TTL}$ that is low in level and applied externally, and on the basis of this output signal at the node 12, timing signals $\phi_1$ and P are generated. In this circuit, it is necessary that the level of the voltage at the node 12 is at a low level that is sufficiently lower than the threshold voltage of the MOST when the small input signal $\overline{\phi}_{TTL}$ is at the high level. Therefore, the size occupied by the MOST $Q_{13}$ on the integrated circuit chip should be sufficiently large with respect to that of the MOST $Q_{12}$. On the other hand, an input capacitance at the gate of the MOST $Q_{13}$ must be small, because the input signal $\overline{\phi}_{TTL}$ applied to the gate of the MOST $Q_{13}$ is very small. Moreover, the power consumed in the inverter composed of MOST's $Q_{12}$, $Q_{13}$ must be small. Therefore, the MOST $Q_{13}$ is necessarily small in size and hence cannot be employed in practice to derive the signal $\phi_1$ directly from the node 12 or to connect the node 12 directly to the gate of the MOST $Q_{18}$, because the operating speed is decreased as a result of the heavy load for the MOST $Q_{13}$. Accordingly, the loading upon the node 12 is reduced by inserting a buffer circuit between the node 12 and the stages for generating the signals $\phi_1$ and P, respectively, as shown in FIG. 7, but the signal $\phi_1$ begins to rise after the responses of the five stages of inverters. This response time must be reduced in order to attain high speed memory operation.

Figure 5:
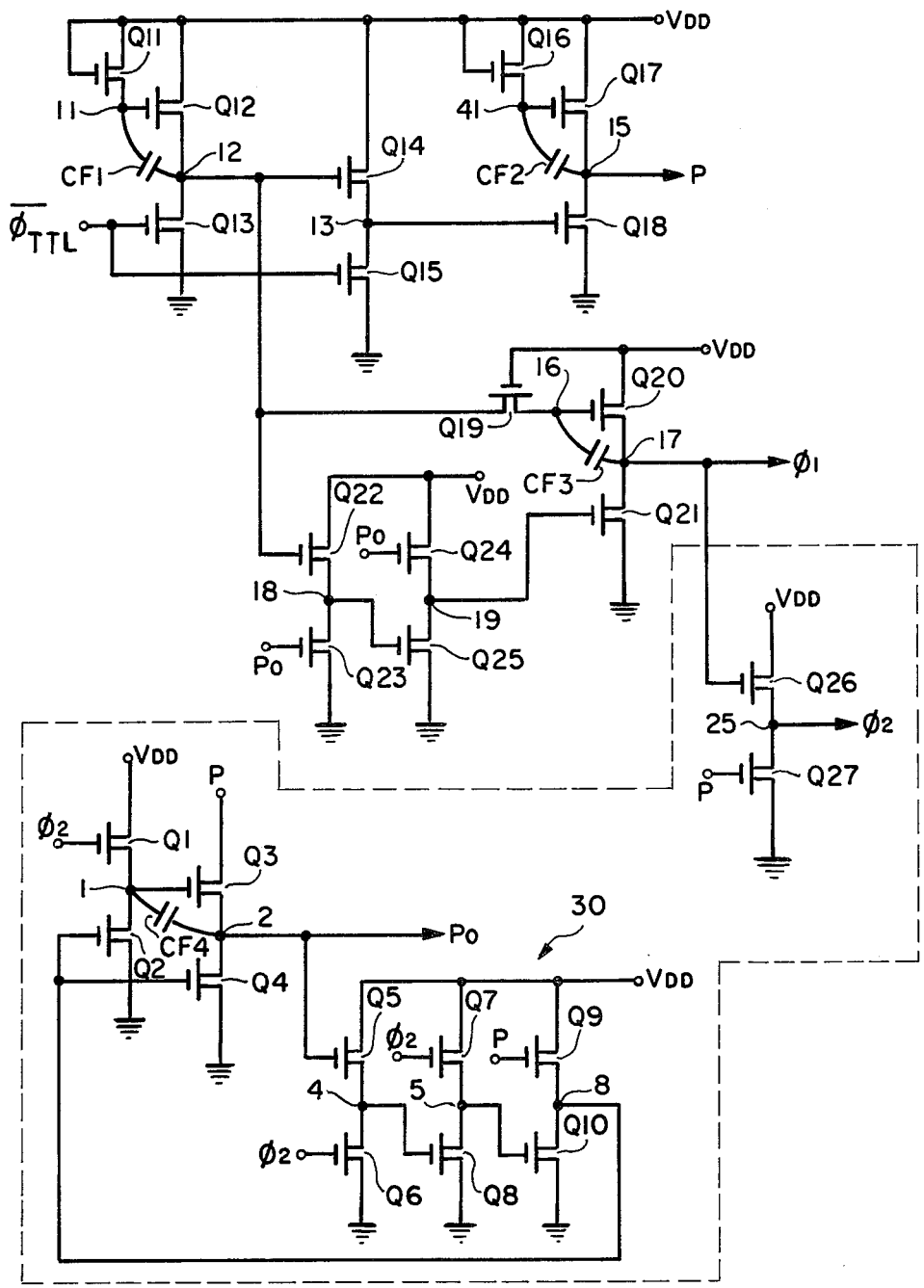
FIG. 5 is a circuit diagram of a timing signal generator for a memory circuit in which the circuit of FIG. 3 is incorporated.

The circuit shown in FIG. 5 is composed by adding a circuit encircled by the broken line which contains the circuit according to the present invention, to the circuit shown in FIG. 7 for the purpose of fulfilling the above requirement. More particularly, the signal $\phi$ applied to the respective gates of the MOST's $Q_1$, $Q_6$ and $Q_7$ in the circuit shown in FIG. 3, is replaced by a signal $\phi_2$ generated by the MOST's $Q_{26}$ and $Q_{27}$. In addition, the signal $\phi$ applied to the drain of the MOST $Q_3$ and to the gate of the MOST $Q_9$ in the circuit of FIG. 3 is replaced by the precharge signal P generated at the output node 15. Furthermore, a signal $P_o$ at the output node 2 is replaced for the signal P applied to the respective gates of the MOST's $Q_{23}$ and $Q_{24}$ in the circuit shown in FIG. 7. The signal $\phi_2$ is generated at the common junction 25 of the source of the MOST $Q_{26}$ and the drain of the MOST $Q_{27}$, and to the gate of the MOST $Q_{26}$ is applied the signal $\phi_1$, while to the gate of the MOST $Q_{27}$ is applied the signal P. The drain of the MOST $Q_{26}$ is connected to the power supply $V_{DD}$, and the source of the MOST $Q_{27}$ is grounded. The other portions of the circuit of FIG. 5 are similar to those of the circuits shown in FIGS. 3 and 7.

Figure 6:
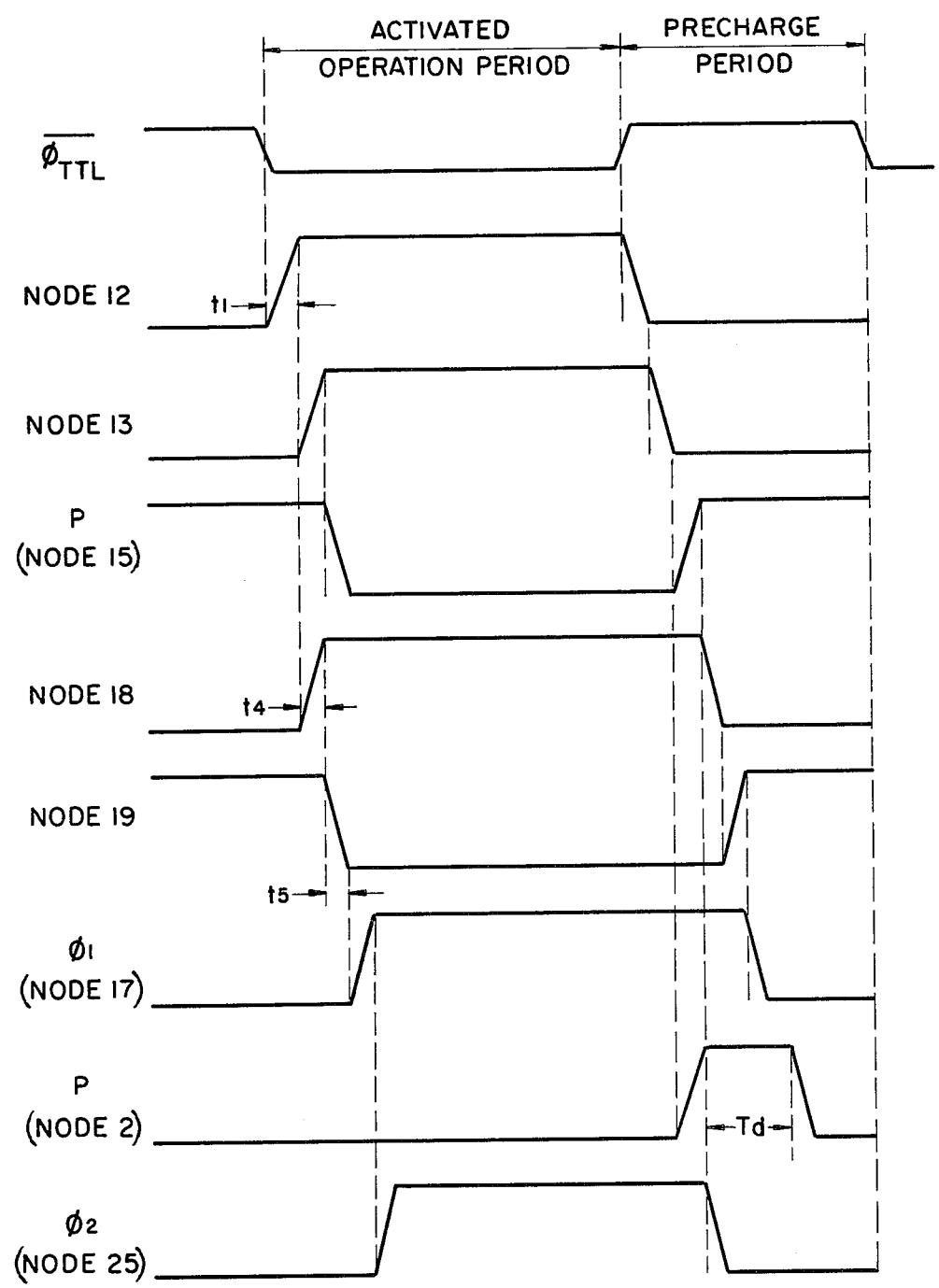
FIG. 6 is an operation waveform diagram for the circuit shown in FIG. 5.

The operation of the circuit shown in FIG. 5 is described with reference to FIG. 6. The description of the operation of the circuit shown in FIG. 5 is limited to what is different from the previous description of the circuit of FIG. 7 with reference to FIG. 8. As shown in FIG. 6, the timing signal $P_o$ rises synchronously with the signal P, and falls so as to have a pulse width determined in the signal generator circuit for the signal $P_o$, and since the timing signal reaches the ground potential within the reset-precharge period, at a time just before the signal $\bar{\phi}_{TTL}$ transfers to a low level, the MOST's $Q_{23}$ and $Q_{24}$ are non-conducting as distinguished from the circuit shown in FIG. 7. When the signal $\bar{\phi}_{TTL}$ turns to a low level, the potential of the node 12 and then the potential of the node 13 rise, so that the signal P transfers to a low level lower than the threshold voltage of the MOST. However, since the MOST $Q_{23}$ is non-conducting, simultaneously with the voltage rise at the nodes 11 and 12, the potential at the node 18 rises up to the potential of $(V_{DD} - V_{TH})$ by charging through the MOST $Q_{22}$. Since the MOST $Q_{24}$ is also non-conducting, when the node 18 rises exceeding the threshold voltage, the node 19 immediately transfers from the charged level of $(V_{DD} - V_{TH})$ to the ground potential. During the period from the rise of the node 12 to the fall of the node 19, the node 16 rises up to the level of $(V_{DD} - V_{TH})$ by charging through the MOST $Q_{19}$, and the bootstrap capacitor $C_{F3}$ connected between the nodes 16 and 17 is also charged to the same level. When the node 19 falls and the MOST $Q_{21}$ becomes non-conducting, owing to the effect of the bootstrap capacitor $C_{F3}$, the node 16 rises exceeding the level of $V_{DD}$ and hence the MOST $Q_{20}$ is in a fully conducting condition, so that the signal $\phi_1$ rises up to the level $V_{DD}$. In coincidence with the rise of the signal $\phi_1$, the operation of the memory circuit commences. At this time the MOST $Q_{26}$ becomes conducting, and the signal P transfers to a low level and hence the MOST $Q_{27}$ is nearly non-conducting. Accordingly, the signal $\phi_2$ begins to rise up to the level of $(V_{DD} - V_{TH})$. In response to the signal $\phi_2$, the node 5 reaches the level of $(V_{DD} - 2 \times V_{TH})$, while the nodes 4 and 3 attain the ground potential. In addition, the node 2 is brought to a low level similar to the low level of the signal P by charging through the MOST $Q_3$, and the bootstrap capacitor $C_F$ connected between the nodes 1 and 2 is charged up to a level substantially equal to $(V_{DD} - 2 \times V_{TH})$.

When the signal $\bar{\phi}_{TTL}$ transfers to a high level, the node 12 and then the node 13 fall resulting in a rise of the signal P, but when the signal P rises, owing to the effect of the bootstrap capacitor $C_F$, the level at the node 1 rises up to the potential represented by the following formula:

$$V_{DD} - 2 \times V_{TH} + C_F/C_1 + C_F \times V_2,$$

where $C_1$ represents the capacitance of the node 1 and $V_2$ represents the potential at the node 2. The MOST $Q_3$ is in the unsaturated condition, so that the signal $P_o$ rises substantially in synchronism with the signal P. The size of the MOST $Q_{27}$ is selected sufficiently larger than that of the MOST $Q_{26}$ so that the signal $\phi_2$ may take a low level lower than the threshold voltage when the signal P has risen sufficiently. Accordingly, when the signal $P_o$ has risen sufficiently, the signal $\phi_2$ is at a low level, so that the MOST's $Q_6$ and $Q_7$ are non-conducting, and as described previously with reference to FIG. 3, the signal $P_o$ maintains a high level that is substantially equal to the signal P during the period $T_d$ of the delay circuit consisting of the six MOST's $Q_5$ to $Q_{10}$, but when the node 3 rises, the MOST's $Q_2$ and $Q_4$ become conducting and thus the signal $P_o$ transfers quickly to the ground potential.

Figure 8:
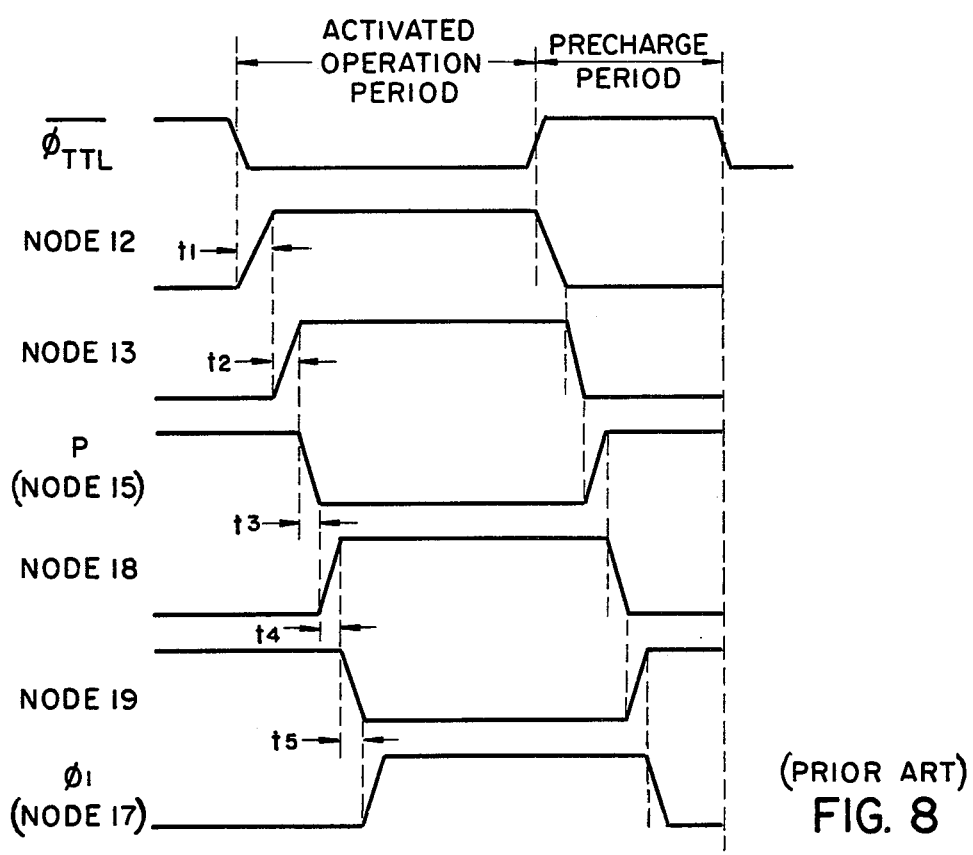
FIG. 8 is an operating waveform diagram for the circuit shown in FIG. 7.

As shown in FIG. 6, the time period from the beginning of the activated operation period when the signal $\bar{\phi}_{TTL}$ turns to a low level until the signal $\bar{\phi}_1$ begins to rise, is equal to $(t_1 + t_4 + t_5)$, and this is shortened by $(t_2 + t_3)$ in comparison to the case shown in FIG. 8. This is a result of the fact that the signal applied to the gates of the MOST's $Q_{23}$ and $Q_{24}$ is replaced by the timing signal $P_o$ so that the node 18 and then the node 19 may respond as soon as the node 12 rises at the beginning of the activated operation period.

From the above description, it will be understood that in a MOS integrated memory circuit operable in response to an externally applied input clock signal, and which employs timing waveforms generated by the circuit according to the present invention, the activated operation period can be considerably shortened.

As described above, according to the present invention, there is provided a circuit for generating an output waveform which rises in synchronism with an input signal pulse and which has a pulse width determined within said circuit in a range of pulse width shorter than the input pulse width, and this circuit is effective for high speed operations of a dynamic circuit employing MOST's.

What is claimed is:

1. A timing signal generator circuit comprising a field-effect transistor having a gate, a source and a drain, said drain being supplied with a first signal of predetermined pulse width, said source being connected to a capacitive output node, and said gate being connected to a capacitive circuit node; means for precharging said circuit node to a voltage sufficient to cause said transistor to be in a conductive state before said first signal is applied to said drain of said transistor; a delay circuit having a predetermined delay time and having an input connected to said output node; and means connected to the output of said delay circuit for discharging said output node and said circuit node following the charging of said capacitive output node to a level indicative of said first signal, when applied in response to the output of said delay circuit.

2. The timing signal generator circuit of claim 1, wherein said precharging means comprises a second field-effect transistor having a gate, a source and a drain, said drain being connected to one terminal of a power source, said source being connected to said circuit node, and said gate being supplied with a second signal opposite in polarity to said first signal.

3. The timing signal generator circuit of claim 2, wherein said discharging means comprises third and fourth field-effect transistors each having a gate, a source and a drain, said gates of said third and fourth transistors being connected to the output of said delay circuit, said sources of said third and fourth transistors being connected to the other terminal of said power source, and said drains of said third and fourth transistors being respectively connected to said circuit node and said output node.

4. The timing signal generator circuit of claim 3, further comprising a capacitor connected between said output node and said circuit node.

5. The timing signal generator circuit of claim 4, wherein said delay time of said delay circuit is shorter than the pulse width of said first signal.

6. The timing signal generator circuit of claim 3, in which said delay circuit includes first, second and third pairs of additional series-connected field-effect transistors connected in cascade, the gate of one of said first pair of transistor being connected to said output node, said output of said delay circuit being defined at the source-drain connection of said third pair of additional transistors.

7. The timing signal generator circuit of claim 6, in which said second signal is applied to the gate of the other transistor in said first pair of additional transistors and to the gate of one of said second pair of transistors, and said first signal is applied to the gate of one of said third pair of transistors.

8. The timing signal generator circuit of claim 1, wherein said discharging means comprises second and third field-effect transistors each having a gate, a source and a drain, said gates of said second and third transistors being connected to the output of said delay circuit, said sources of said second and third transistors being connected to the other terminal of said power source, and said drains of said second and third transistors being respectively connected to said circuit node and said output node.

9. The timing signal generator circuit of claim 1, further comprising a capacitor connected between said output node and said circuit node.

10. The timing signal generator circuit of claim 1, wherein said delay time of said delay circuit is shorter than the pulse width of said first signal.

* * * * *